United States Patent [19]

Minner

[11] 4,316,101
[45] Feb. 16, 1982

[54] CIRCUIT FOR SWITCHING AND TRANSMITTING ALTERNATING VOLTAGES

[75] Inventor: Willy Minner, Schwaigern, Fed. Rep. of Germany

[73] Assignee: Licentia-Patent-Verwaltungs-G.m.b.H., Frankfurt am Main, Fed. Rep. of Germany

[21] Appl. No.: 97,910

[22] Filed: Nov. 28, 1979

[30] Foreign Application Priority Data

Nov. 30, 1978 [DE] Fed. Rep. of Germany ....... 2851789

[51] Int. Cl.$^3$ ............................................. H03K 17/60
[52] U.S. Cl. .................................... 307/578; 307/279; 307/304
[58] Field of Search ...................... 307/251, 279, 304

[56] References Cited

U.S. PATENT DOCUMENTS

| | | | |
|---|---|---|---|
| 3,246,173 | 4/1966 | Silver | 307/251 |
| 3,313,958 | 4/1967 | Bowers | 307/251 |
| 3,524,996 | 8/1970 | Raper et al. | 307/251 |
| 3,678,297 | 7/1972 | Takahashi | 307/251 |
| 3,731,116 | 5/1973 | Hill | 307/251 |
| 3,872,325 | 3/1975 | Adams et al. | 307/251 |

*Primary Examiner*—Harold A. Dixon
*Attorney, Agent, or Firm*—Spencer & Kaye

[57] ABSTRACT

A circuit for switching and transmitting alternating voltages comprise an MOS transistor, the pn-junctions which surround the source and drain regions being biased in a blocking direction in the driven condition of the transistor, correspondence between the potential difference between gate and alternating voltages and the required drive voltage of the transistor being achieved by a circuit which largely synchronizes gate voltage changes with the alternating voltage to be transmitted.

8 Claims, 8 Drawing Figures

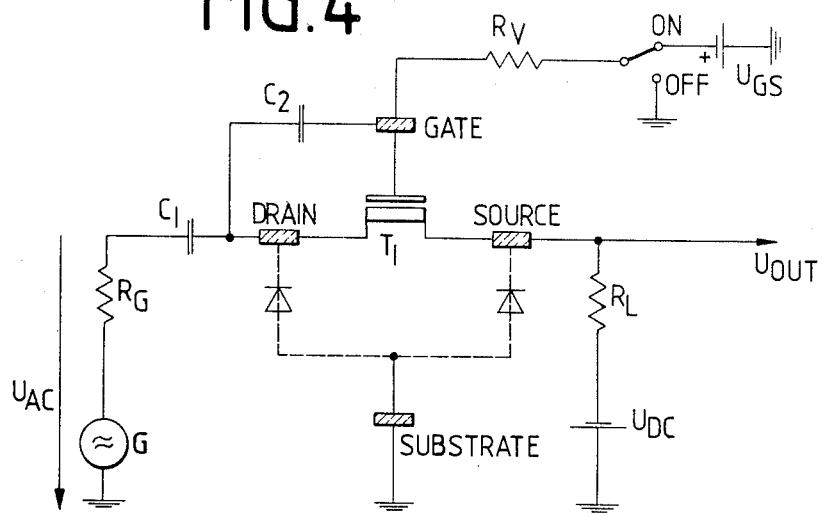
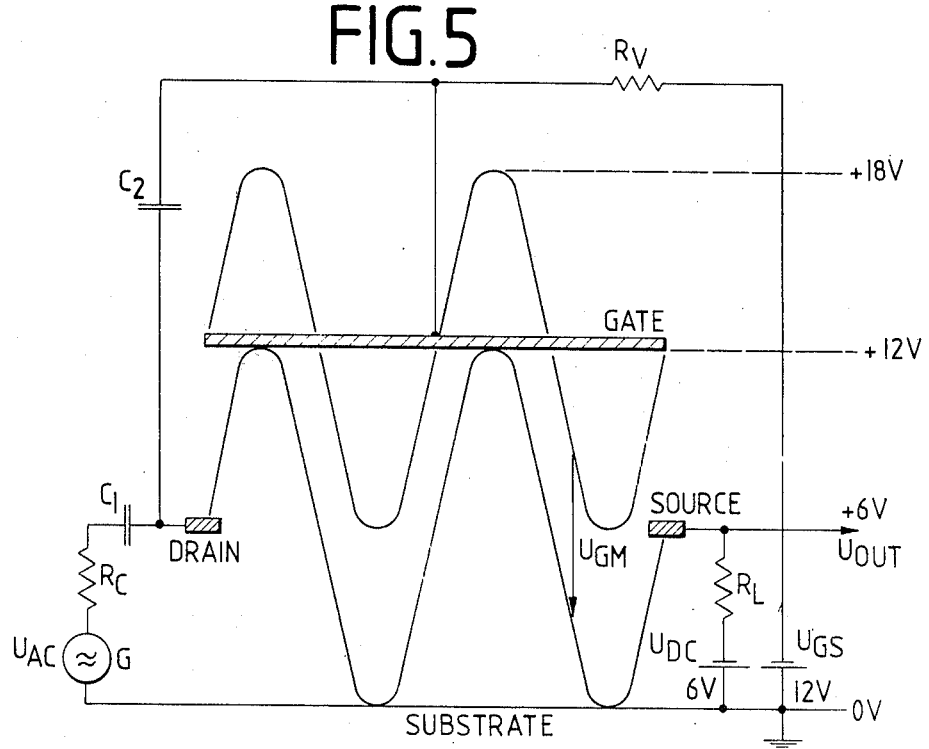

4,316,101

CIRCUIT FOR SWITCHING AND TRANSMITTING ALTERNATING VOLTAGES

BACKGROUND OF THE INVENTION

The invention relates to a circuit for switching and transmitting alternating voltages having an MOS transistor, the lower pn-junctions of which, surrounding the source and the drain region, are biased in a blocking direction in the driven condition of the transistor.

MOS transistors having a gate connection isolated from the semiconductor body are replacing relays in many fields of application. The MOS switching transistor does not require any control power and operates at switching speed of a few μsec and is free of click or chatter.

SUMMARY OF THE INVENTION

It is an object of the invention to provide a circuit arrangement by means of which distortion may be avoided when transmitting the alternating voltage and the voltage between the gate and the substrate connection may be selected so as to be as small as possible.

According to the invention, there is provided a circuit for switching and transmitting alternating voltages comprising an MOS transistor with a gate and source and drain regions, pn-junction surrounding said source and drain regions and biased in a blocking direction when said MOS transistor is driven and switching means for largely synchronising gate voltage changes with an alternating voltage to be transmitted to provide correspondence between instantaneous potential differences between gate and alternating voltages and the drive voltage of said transistor.

Further according to the invention, there is provided a circuit for switching and transmitting alternating voltages having an MOS transistor, the pn-junctions, of which, surrounding the source and drain regions, are biased in a blocking direction in the driven condition of the transistor, wherein circuit means are provided for largely synchronising the gate voltage changes, in the driven condition of the transistor, with the alternating voltage to be transmitted, whereby the instantaneous potential difference between the gate voltage and the alternating voltage to be transmitted corresponds to the switching voltage which is required in order to drive the transistor.

BRIEF DESCRIPTION OF THE DRAWINGS

The invention will now be described in greater detail, by way of example, with reference to the drawings, in which:

FIG. 4 shows a general circuit according to the invention;

FIG. 5 is a diagram showing the voltage ratio of the circuit of FIG. 4;

DESCRIPTION OF THE PREFERRED EMBODIMENTS

Basically the invention proposes to provide a circuit for switching and transmitting alternating voltages using an MOS transistor where pn-junctions surrounding the source and drain regions are biased in a blocking direction in the driven condition of the transistor. In this circuit circuit means are provided for largely synchronising the gate voltage changes with the alternating voltage to be transmitted when the transistor is being driven, whereby the instantaneous potential difference between the gate voltage and the alternating voltage to be transmitted corresponds to the switching voltage which is required in order to drive the transistor.

Figure 1:
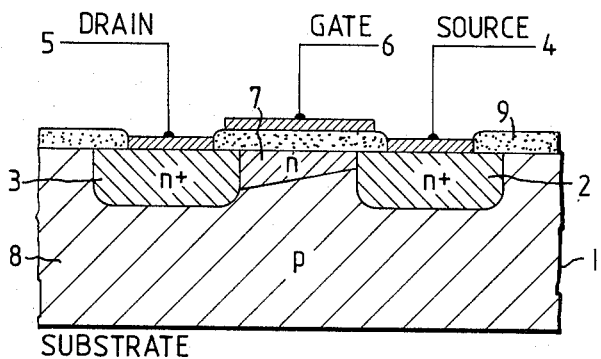
FIG. 1 is a sectional view of a known N-MOS transistor.

In FIG. 1 a N-MOS transistor 1 is shown in section, this transistor being suitable for switching and transmitting alternating voltages. A p-conductive substrate 8 contains two n+-doped regions 2 and 3 which are inserted into the semiconductor body from one surface, these regions 2 and 3 forming the source and the drain and thus being provided with a source or a drain connection contact 4 or 5 respectively. The area between the two n+-conducting semiconductor regions 2 and 3 is covered by a layer of oxide 9 on which is arranged the metal contact 6 forming the gate connection. If an appropriately positive potential is applied to the metal gate contact the original p-conductivity in the channel region between the source and the drain is inverted and an n-conducting channel 7 is formed between the source and the drain region. If the gate voltage, in relation to the source connection, amounts to between 6 and 18 V for example, then the connection between the source and the drain regions is very low in resistance (a few Ω) across the n-conduction channel which has been formed. If the gate voltage is reduced to 0 V approximately so that an n-conducting channel cannot be formed between the source and the drain and so that the two n+-conducting semi-conductor regions are separated from each other by the p-conducting substrate material, then the blocking resistance is some 10 k Ω.

If an alternating voltage is applied to the drain or to the source connection and this alternating voltage is greater in its peak amplitude than the flow voltage of the pn-junction between the source or drain region and the substrate, then this diode becomes conductive and, when transmitting the alternating voltage in the conducting condition, noticeable distortions are formed between the drain and the source. This is the case if the alternating voltage exceeds the value of 0.4 to 0.7 V in its peak amplitude. In order to avoid these distortions when transmitting the alternating voltage, a direct voltage $U_{DC}$ must be superimposed on the alternating voltage $U_{AC}$.

Figure 2:
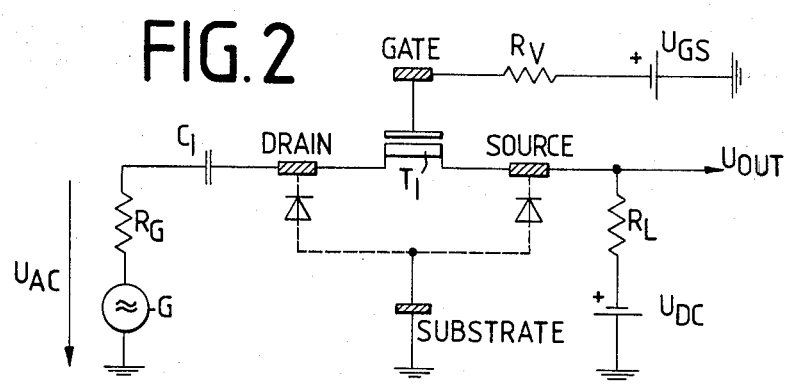
FIG. 2 is a corresponding circuit to the transistor of FIG. 1.

A corresponding circuit is shown in FIG. 2. The diodes shown in this Figure and in the other circuit drawings indicate the pn-junctions between the substrate of a N-MOS transistor according to FIG. 1 and the source or drain region. These diodes are always to remain blocked when transmitting alternating voltages via the field-effect transistor. An alternating voltage $U_{AC}$ is applied to the drain electrode of the transistor $T_1$, for example, via the generator resistor $R_G$ and the capacitance $C_1$, the time path of which alternating voltage $U_{AC}$ is apparent from the voltage diagram of FIG. 3. In order to superimpose a direct voltage on this alternating voltage in the switched-through or ON-condition of the transistor $T_1$, a direct voltage source $U_{DC}$ is connected, for example, to the low end of the load resistor $R_L$. The substrate of the transistor $T_1$ is at earth potential while the gate connection of the transistor is connected via the series resistor $R_V$ to the voltage source $U_{GS}$ which delivers the gate voltage. Since, in the switched-on through condition, the connection between the drain and the source is of very low resistance, the direct voltage potential is transmitted from the source connection to the drain connection and is superimposed on the alternating voltage $U_{AC}$.

In order that the pn-junctions of the field-effect transistor may be safely prevented from being cut through the direct voltage $U_{DC}$ must either correspond approximately to the peak alternating voltage $\sqrt{2}U_{AC}$ which is present or be greater than it. In the conducting condition of the transistor $T_1$, a positive direct voltage $U_{GS}$ is supplied to the gate connection via the series resistor $R_V$. Thus the series resistor $R_V$ may be some 10 k $\Omega$ in size, since a MOS switching transistor does not require effective power in order to be triggered. In order to always ensure safe driving of the field-effect transistor, a minimum voltage $U_{GM}$ must always be present between the gate and the source connection and this minimum voltage amounts, for example, to 6 V. In order that this minimum voltage is maintained, the voltage $U_{GS}$ must have the following value in accordance with the diagram of FIG. 3:

$$U_{GS} \geq U_{GM} + U_{DC} + \sqrt{2}\, U_{AC}$$

Figure 3:
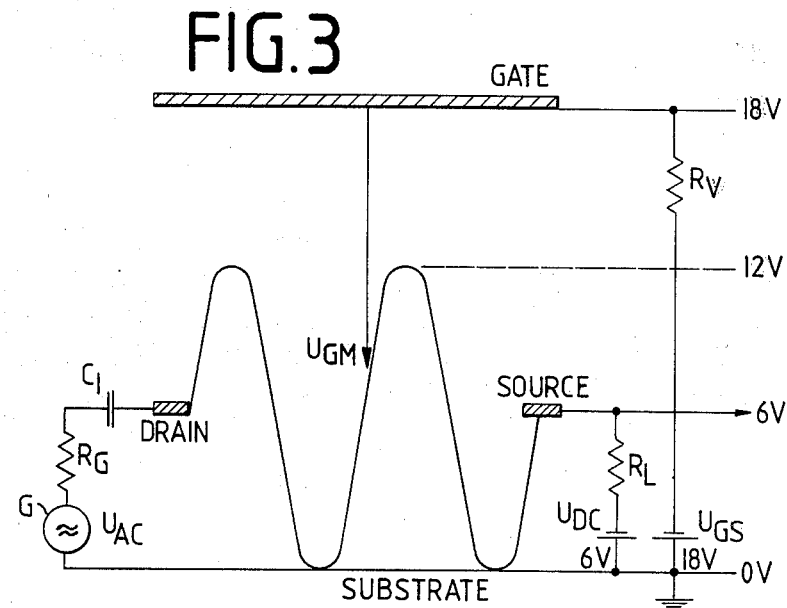
FIG. 3 is a voltage diagram of the circuit of FIG. 2.

With an arrangement in accordance with FIG. 3, the peak voltage of the alternating voltage to be transmitted should amount, for example, to 6 V. Then, in order to prevent the pn-junctions from being cut through $U_{DC}$ must also be at least 6 V in size. Since the voltage $U_{GM}$ required in order to drive the transistor also amounts, by way of example, to 6 V, the voltage $U_{GS}$ must amount to approximately 18 V. The ratios described are apparent in greater detail from FIG. 3.

With this process, the fact that the resistance of the conducting channel, which is many cases designated as the $R_{ON}$ resistance, itself depends on the instantaneous value of the voltage difference $U_{GM}$ between the gate connection and the source connection must be taken into account, so that the alternating current flowing through the switch is affected and deformation or distortion of the alternating voltage may occur. The following is true for the starting alternating voltage $U_{OUT}$:

$$U_{OUT} = \frac{U_{IN}}{1 + \frac{R_{ON}}{R_L} \cdot \frac{\Delta R_{ON}}{R_L}}$$

whereby $\Delta R_{ON}$ designates the change in the $R_{ON}$ resistance caused by different direct voltages $U_{GM}$ between the gate and the source connection. With the embodiment shown in FIG. 3 the $R_{ON}$ resistance is approximately twice as large with the voltage $U_{GM}=6$ V as with $U_{GM}=18$ V, and it is easily understood that disruptive distortions and the formation of harmonics arise therefrom.

A further disadvantage of the circuit arrangement in accordance with FIG. 2 lies in the face that the gate substrate voltage $U_{GS}$ must be approximately 18 V in value, in accordance with the diagram of FIG. 3, if a peak-to-peak alternating voltage of conventional size of $U_{SS}=12$ V is to be transmitted. In many cases, only an operating direct voltage of approximately 12 V is present in devices, from which operating direct voltage slightly smaller voltages may be derived easily while larger voltages may be derived only with a large technical cost.

The invention provides a circuit arrangement by means of which distortion maybe reduced or avoided when transmitting alternating voltages and the voltage between the gate and substrate connections may be selected to be as small as possible.

In a circuit as described above, the invention provides switching means by means of which the gate voltage in the driven condition of the transistor changes largely synchronously with the alternating voltage to be transmitted, whereby the instantaneous potential difference between the gate voltage $U_{GS}$ and the alternating voltage $U_{AC}$ which is to be transmitted corresponds to the switching voltage $U_{GM}$ which is required in order to drive the transistor.

In a preferred embodiment, suitable circuit means are a capacitor which is connected between the transmission path of the MOS field-effect transistor and the gate connection of this transistor. The capacitor is connected, for example, between the drain connection and the gate connection of the field-effect transistor, yet connection is also possible between the source connection and the gate connection since, in the switched-on condition of the transistor, the connection between the source and the drain is of low resistance so that the alternating voltage is transmitted in any case via the capacitor to the gate connection.

In FIG. 4 the general circuit according to the invention is shown. The drain electrode of the MOS field-effect transistor $T_1$ is connected via the capacitor $C_2$ to the gate connection, this gate connection being connected in turn via the series resistor $R_V$ to a switch. This series resistor $R_V$ is connected through the switch either to earth potential or to the voltage source $U_{GS}$, according to whether a transmission channel is to be formed between the drain and the source of the transistor or not.

The capacitative impedance of the capacitor $C_2$ should correspond at most to the impedance of the series resistor $R_V$ for the lower limit frequency. Then the following is true:

$$\frac{1}{2\pi f_u \cdot C_2} \leq R_V$$

whereby $f_u$ is the lower limit frequency. In the case of this dimensioning of the capacitative impedance the phase shift caused by the capacitance will not exceed the values permitted for the operation of the MOS field-effect transistor. The direct voltage $U_{DC}$ which is to be superimposed on the alternating voltage $U_{AC}$ is in turn applied, as was also the case in the circuit according to FIG. 2, to the low end of the load resistor $R_L$, which is connected to the source connection.

The voltage ratios are apparent in a circuit in accordance with FIG. 4 from the diagram of FIG. 5. The voltage $U_{DC}$ is selected such that the pn-junctions surrounding both the source and the drain always remain blocked when an alternating voltage $U_{AC}$ is present. This is the case if $U_{DC}$ has at least the value of $\sqrt{2}.U_{AC}$. If the same voltage ratios as selected according to the diagram of FIG. 3 are chosen, this means a peak-to-peak voltage $U_{SS}$ of the alternating voltage $U_{AC}$ to 12 V in the case of a direct voltage $U_{DC}=6$ V. The gate-substrate voltage $U_{GS}$ of the field-effect transistor must also amount only to 12 V since the alternating voltage $U_{AC}$ is added on at the gate itself via the capacitor $C_2$, so that the instantaneous value of the voltage difference $U_{GM}$ between the gate voltage and the source voltage remains constant and so large that the transistor operates always safely in the switched through condition. Since $U_{GM}$ is constant, harmonics and distortions due to superimposition cannot occur. Moreover, the largest direct voltage $U_{GS}$ necessary is not greater than the peak-to-peak voltage $U_{SS}$ of the alternating voltage $U_{AC}$.

It should be noted that the capacitor $C_2$ may be connected between the source and the gate because of the drain-source path of the MOS transistor $T_1$, which path is of low resistance in ON-operation. Furthermore, the direct voltage $U_{DC}$ may also be passed directly to the drain connection.

For reverse operation with extremely high channel resistance, the externally connected capacitor $C_2$ increases the internal capacitance of the switch between the drain and the gate. Thus the dynamic blocking resistance $R_{OFF}$ of the MOS field-effect transistor is reduced by a factor 2. In order to prevent this disadvantageous effect, a circuit in accordance with FIG. 6 is used.

Figure 6:
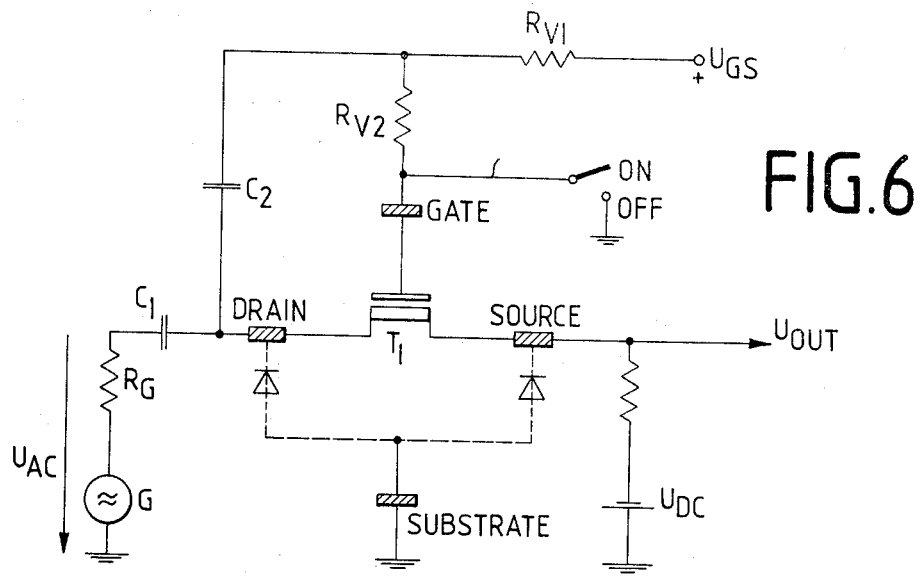
FIG. 6 shows a modified circuit according to the invention.

With the circuit according to FIG. 6, the voltage $U_{GS}$ for ON-operation of the transistor is supplied to the gate connection of the transistor $T_1$ via the series resistors $R_{V1}$ and $R_{V2}$. The gate connection draws alternating voltage via the capacitor $C_2$ which is connected to the connection point between the two resistors $R_{V1}$ and $R_{V2}$. The capacitative resistance of $C_2$ is selected such that:-

$$\frac{1}{2\eta f_u \cdot C_2} \leq R_{V1}$$

for the lower limit frequency. Switching off the MOS transistor, i.e. the OFF-operation, is caused by applying the gate connection directly to zero potential or to earth. This takes place via the control line shown in FIG. 6 and connected to the gate.

ON-operation is brought about by separating the gate from the earth connection so that the voltage $U_{GS}$ becomes effective, via the resistors $R_{V1}$ and $R_{V2}$, at the gate. Switching off the MOS transistor $T_1$ via the said control line has the advantage that the capacitance $C_2$ is no longer able to affect the gate and the blocking resistor $R_{OFF}$ is no longer changed.

Figure 7:
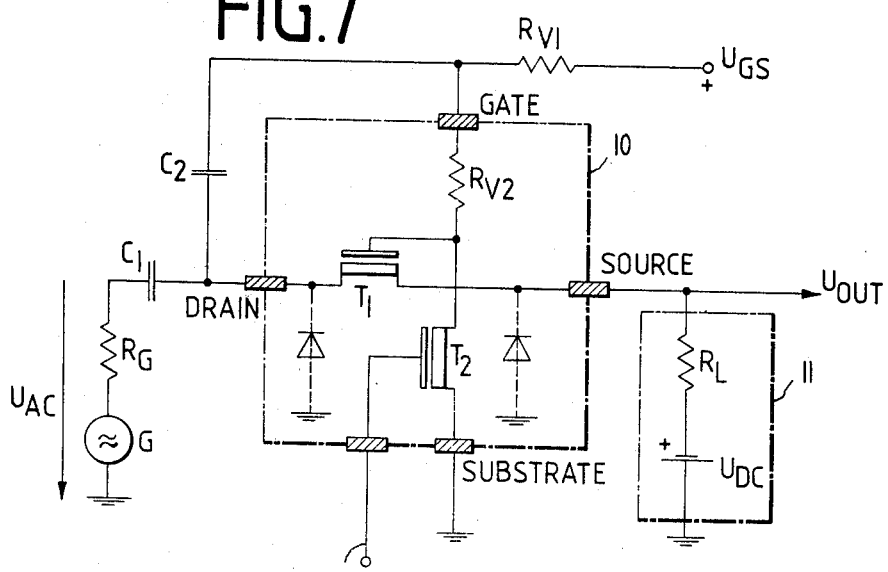
FIG. 7 shows a circuit according to the invention suitable for integrated formation.

A circuit component suitable for integration is shown in FIG. 7. The control line present in FIG. 6 is isolated with the aid of an additional transistor $T_2$. The gate connection of the switching transistor $T_1$ is connected via the integrated resistor $R_{V2}$ and via the external resistor $R_{V1}$ to the voltage source $U_{GS}$. On the other hand the gate connection of the transistor $T_1$ is connected to the drain connection of the end transistor $T_2$ of a control logic unit. The capacitor $C_2$ is connected in accordance with FIG. 6.

The gate connection line of the end transistor $T_2$ forms the control line for switching on and switching off the transistor $T_1$. With appropriate potential at the gate connection of the transistor $T_2$, which transistor remains blocked by means of this potential, the transistor $T_1$ operates in ON-operation whereby the superimposed alternating voltage $U_{AC}$ is supplied via the capacitor $C_2$ to the gate connection of the transistor $T_1$ as well as the direct voltage $U_{GS}$. The channel resistor $R_{ON}$ remains almost constant. The direct voltage $U_{GS}$ is correctly dimensioned in an embodiment if the following is true:

$$U_{GS} = 6 V + U_{DC}$$

$$\text{if } U_{DC} = \sqrt{2} \cdot U_{AC}.$$

If the potential at the control line of the transistor $T_2$ is changed so that the transistor $T_2$ is driven, then the transistor $T_1$ is blocked and the alternating voltage $U_{AC}$ can no longer be transmitted to the source connection. The alternating voltage $U_{AC}$ is not able to have any effect or only an insubstantial effect on the gate of the transistor $T_1$, since the resistance $R_{V2}$ may be selected very large as compared to the differential resistance of the logic transistor $T_2$. The integratable part of the circuit is indicated in FIG. 7 by the broken line 10.

The circuit in accordance with the invention is particularly suitable for switching loudspeakers on and off. In this case and in accordance with FIG. 8 the circuit member 11 from FIG. 7 is modified in accordance with the circuit according to FIG. 8. The loudspeaker L is connected in parallel to the series connection comprising series resistor $R_1$ and the voltage source $U_{DC}$, whereby the two current branches are separated in terms of direct current by the capacitance $C_3$.

Figure 8:
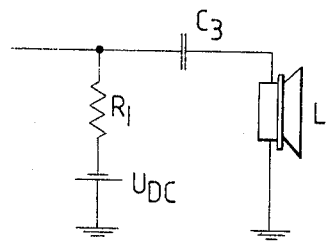
FIG. 8 shows a modification to enable the circuit to switching loud speakers.

The circuit member 11 in accordance with FIG. 7 or in accordance with FIG. 8 is connected to the output connection of the field-effect transistor $T_1$, i.e. to the source electrode. The series resistor $R_1$ is preferably substantially higher in resistance than the load resistor relating to the loudspeaker.

It will be understood that the above description of the present invention is susceptible to various modification changes and adaptations.

What is claimed is:

1. In a circuit for switching and transmitting alternating voltages having an MOS transistor provided with a gate and further provided with source and drain regions surrounded by pn-junctions, biassing means connected to bias both junctions in their blocking direction in the driven condition of the transistor, and circuit means connected for substantially synchronising the gate voltage changes, in the driven condition of the transistor, with the alternating voltage to be transmitted, the improvement wherein said circuit means comprise a capacitance connected between the transmission path of said MOS transistor and said gate for causing the instantaneous potential difference between the gate voltage and the alternating voltage to be transmitted to correspond to the switching voltage which is required in order to drive said transistor.

2. A circuit as defined to claim 1, wherein said capacitance is connected between said drain connection and said gate connection of said MOS transistor.

3. A circuit as defined in claim 2 further comprising a control transistor having a switchable path connected to the gate connection of said MOS transistor.

4. A circuit as defined in claim 3, wherein said control transistor is a second MOS transistor with a drain connection connected to the gate connection of said first-recited MOS transistor for transmitting said alternating voltage; and a further series resistor is connected between a connection of said two MOS transistors and a centre connection of a series circuit comprising said capacitance and a series resistance, connected to a d.c voltage source.

5. A circuit as defined in claim 1, wherein the gate connection of said MOS field-effect transistor is connected to one pole of a voltage source which delivers direct voltage to said gate via a series resistance and said capacitance between said gate connection and said source or drain connection has a value $$\frac{1}{2\pi f_u \cdot C_2} \leq R_V$$

where $f_u$ is the lower limit frequency of the alternating voltage $U_{AC}$ which is to be transmitted.

6. A circuit as defined in claim 1 wherein a direct voltage is applied to said source or drain connection of the said MOS field-effect transistor with said direct voltage being so large and so poled that said pn-junctions surrounding said source and drain regions always remain blocked for the maximum alternating voltage transmitted in ON operation of the transistor.

7. A circuit as defined in claim 6, wherein said direct voltage applied to said source or drain connection has the following value:

$$U_{DC} \geq \sqrt{2 \, U_{ACmax}}$$

whereby $U_{ACmax}$ is the effective value of the maximum alternating voltage to be transmitted.

8. A circuit as defined in claim 1 wherein said MOS field-effect transistor has a n-conducting channel.

* * * * *